United States Patent
Choi et al.

(10) Patent No.: US 10,007,324 B2
(45) Date of Patent: Jun. 26, 2018

(54) MEMORY SYSTEM

(71) Applicant: SK hynix Inc., Gyeonggi-do (KR)

(72) Inventors: An Ho Choi, Gyeonggi-do (KR); Yeong Eun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 138 days.

(21) Appl. No.: 14/940,282

(22) Filed: Nov. 13, 2015

(65) Prior Publication Data

US 2016/0370847 A1 Dec. 22, 2016

(30) Foreign Application Priority Data

Jun. 16, 2015 (KR) ........................ 10-2015-0085398

(51) Int. Cl.
*G06F 1/00* (2006.01)
*G06F 1/32* (2006.01)
*G06F 11/14* (2006.01)
*G11C 5/14* (2006.01)

(52) U.S. Cl.
CPC .......... *G06F 1/3287* (2013.01); *G06F 1/3225* (2013.01); *G06F 1/3275* (2013.01); *G06F 11/1441* (2013.01); *G11C 5/143* (2013.01); *G11C 5/147* (2013.01); *Y02D 10/14* (2018.01)

(58) Field of Classification Search
None
See application file for complete search history.

(56) References Cited

U.S. PATENT DOCUMENTS

| | | | | |
|---|---|---|---|---|
| 8,473,760 B2* | 6/2013 | Takeyama | ........... | G06F 11/1441 713/1 |
| 2007/0263469 A1* | 11/2007 | Cornwell | ............... | G11C 5/145 365/226 |
| 2012/0245744 A1* | 9/2012 | Prosser | ..................... | H02J 3/46 700/286 |
| 2013/0207695 A1* | 8/2013 | Jeon | ........................ | H02J 9/061 327/109 |
| 2016/0077561 A1* | 3/2016 | Kimura | ................... | G06F 1/266 713/323 |

FOREIGN PATENT DOCUMENTS

| | | |
|---|---|---|
| KR | 1020120033372 | 4/2012 |
| KR | 1020150018682 | 2/2015 |

* cited by examiner

*Primary Examiner* — Paul Yen
(74) *Attorney, Agent, or Firm* — IP & T Group LLP

(57) ABSTRACT

A memory system includes a memory device, to which a first power is supplied, and in which data is stored; a controller, to which s second power is supplied, and which is configured to control the memory device; an interface, to which a third power is supplied, and which is configured to transmit a command and data between the controller and the memory device; and a Low Dropout (LDO) Regulator configured to convert the first power into the third power and supply the third power to the interface.

18 Claims, 3 Drawing Sheets

MEMORY SYSTEM

CROSS-REFERENCE TO RELATED APPLICATION

The present application claims priority to Korean patent application number 10-2015-0085398, filed on Jun. 16, 2015, in the Korean Intellectual Property Office, the entire disclosure of which is herein incorporated by reference in its entirety.

BACKGROUND

1. Field

Various embodiments of the present disclosure relate to a memory system, and more particularly, to a memory system including a memory device and a memory controller.

2. Discussion of Related Art

Memory systems include a memory device for storing data and a controller for controlling the memory device. The memory systems are used in various electronic devices, such as a computer and a portable phone.

The capacity of memory devices is gradually increasing by use of big data. When the capacity of the memory devices is increased, the probability of an overload occurring in the memory devices is also increased. For example, when a memory device includes a plurality of storage devices, to increase the capacity, the number of storage devices included in the memory device may be increased. Accordingly, when a large number of the storage devices are simultaneously operated, an overload may occur.

In general, an interface for exchanging a command and data between a memory device and a controller operates by receiving power used in the controller. Accordingly, when an overload occurs in the memory device, the power may flow backward from the memory device to the controller. The power flowing backward is referred to as back power. When back power is generated, a voltage having a high level may be momentarily applied to the controller, and thus the controller may be damaged.

When the controller is damaged, the memory system may operate incorrectly or may not work even though the memory device is normal. Thus, the reliability of the memory system may deteriorate.

SUMMARY

Various embodiments of the present invention provide a memory system, in which even when back power is generated in a memory device, a controller is not influenced by the back power.

An embodiment of the present disclosure provides a memory system including a memory device, to which a first power is supplied, and in which data is stored; a controller, to which a second power is supplied, and which is configured to control the memory device; an interface, to which a third power is supplied, and which is configured to transmit a command and data between the controller and the memory device; and a Low Dropout (LDO) Regulator configured to convert the first power into the third power and supply the third power to the interface.

An embodiment of the present disclosure provides a memory system including a memory device, to which power is supplied through a first power terminal; a controller, to which power is supplied through a second power terminal; an interface configured to transmit a command and data between the controller and the memory device; and a Low Dropout (LDO) Regulator configured to reduce power supplied through the first power terminal and supply the reduced power to the interface.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present disclosure will become more apparent to those of ordinary skill in the art by describing in detail embodiments thereof with reference to the attached drawings in which.

DETAILED DESCRIPTION

Hereinafter, an exemplary embodiment of the present invention will be described in detail with reference to the accompanying drawings. However, the present invention is not limited to embodiments to be disclosed below, and various forms different from each other may be implemented.

Figure 1:
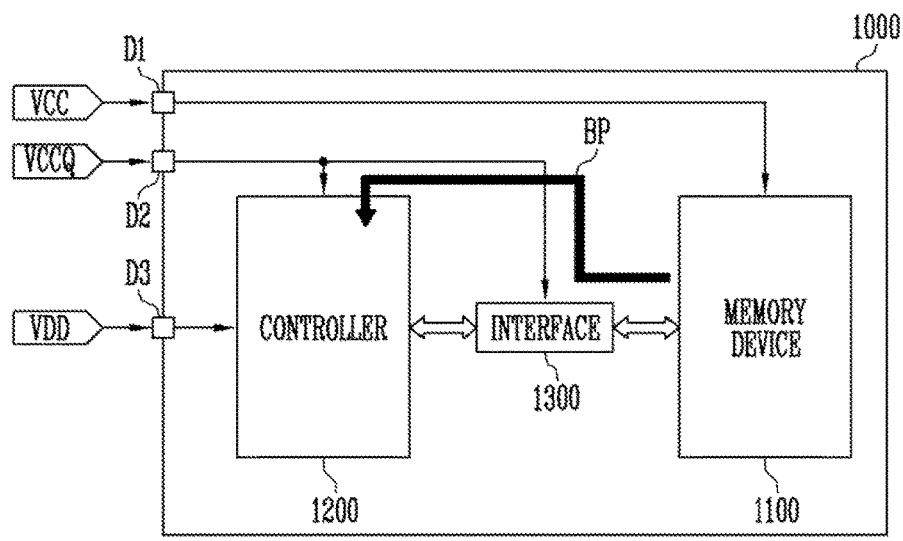
FIG. 1 is a diagram illustrating a memory system according to an embodiment of the present disclosure.

FIG. 1 is a diagram a memory system 1000.

Referring to FIG. 1, the memory system 1000 may include a memory device 1100 for storing data, a controller 1200 for controlling the memory device 1100, and an interface 1300 for exchanging a command and data between the controller 1200 and the memory device 1100.

The memory device 1100 may include a plurality of storage devices. The storage devices may include a volatile memory device or a nonvolatile memory device. The volatile memory device may include a Static Random Access Memory (SRAM), a Dynamic RAM (DRAM), a Synchronous DRAM (SDRAM), or the like. The nonvolatile memory device may include a NAND flash memory, a Vertical NAND flash memory, a NOR Flash Memory, a Resistive Random Access Memory (RRAM), a Phase-Change Memory (PRAM), a Magnetoresistive Random Access Memory (MRAM), a Ferroelectric Random Access Memory (FRAM), a Spin Transfer Torque Random Access Memory (STT-RAM), a charge trap flash, or the like. Further, the nonvolatile memory device may be implemented in a three-dimensional array structure.

The controller 1200 may connect the memory device 1100 with a host (not illustrated). The controller 1200 may control the memory device 1100 in response to a command received from the host and transmit data received from the memory device 1100 to the host.

The interface 1300 is connected between the controller 1200 and the memory device 1100, and provides a memory interface for exchanging the command and data.

Power is supplied from an external device (not illustrated) to operate the memory device 1100, the controller 1200, and the interface 1300. For example, the memory device 1100 receives VCC power from the external device, and the controller 1200 receives VCCQ power and VDD power from the external device. Since the interface 1300 uses the VCCQ power supplied from the controller 1200, the interface 1300 may share the VCCQ power supplied to the controller 1200 with the controller 1200. For example, the VCC power may be 3.3 V, the VCCQ power may be 1.8 V, and the VDD power may be 1.2 V. The VCC power may be supplied to the memory device 1100 through a first power terminal D1 of the memory system 1000, the VCCQ power may be supplied to the controller 1200 and the interface 1300 through a second power terminal D2 of the memory system 1000, and the VDD power may be supplied to the controller 1200 through a third power terminal D3 of the memory system 1000.

The memory device 1100 may include a plurality of storage devices, and when a large number of the storage devices are simultaneously operated or input/output data is momentarily large, an overload is generated in the memory device 1100 so that the power may flow backward. The power flowing backward is referred to as back power BP. The back power BP may flow backward through a line or the interface 1300 connected with the VCC power. Particularly, when the back power BP is generated through the interface 1300, the back power BP may flow backward to the controller 1200 through the interface 1300. That is, the interface 1300 and the controller 1200 share the VCCQ power so that the back power BP may be transmitted to the controller 1200 through a line through which the VCCQ power is supplied.

Figure 2:
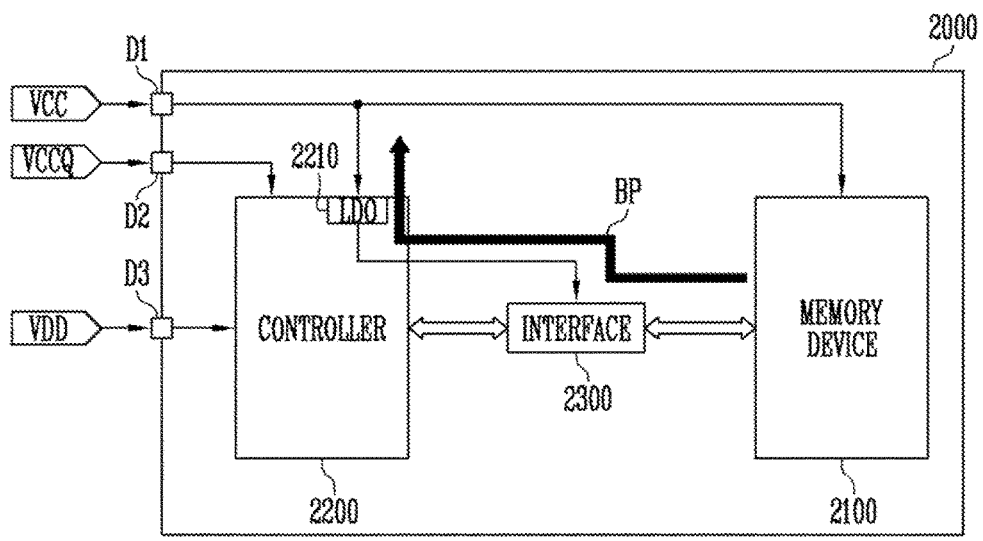
FIG. 2 is a diagram illustrating a memory system according to an embodiment of the present disclosure.

FIG. 2 is a diagram illustrating a memory system 2000 according to an embodiment of the present disclosure.

Referring to FIG. 2, the memory system 2000 may include a memory device 2100 for storing data, a controller 2200 for controlling the memory device 2100, and an interface 2300 for exchanging a command and data between the controller 2200 and the memory device 2100. The controller 2200 includes a low dropout (LDO) regulator 2210 that reduces VCC power to supply the reduced VCC power to the interface 2300.

The memory device 2100 may include a plurality of storage devices. The memory device 2100 is similar to memory device 1100, which has been described with reference to FIG. 1, so that a detailed description of memory device 2100 will be omitted.

The controller 2200 may connect the memory device 2100 with a host (not illustrated). The controller 2200 may control the memory device 2100 in response to a command received from the host and transmit data received from the memory device 2100 to the host.

The interface 2300 is connected between the controller 2200 and the memory device 2100, and provides a memory interface for exchanging the command and data.

Power is supplied from an external device (not illustrated) to operate the memory device 2100, the controller 2200, and the interface 2300. For example, the memory device 2100 receives VCC power from the external device, and the controller 2200 receives VCCQ power and VDD power from the external device. The interface 2300 may receive power through the LDO regulator 2210 included in the controller 2200. For example, the VCC power may be 3.3 V, the VCCQ power may be 1.8 V, and the VDD power may be 1.2 V. The VCC power may be supplied to the memory device 2100 through a first power terminal D1 of the memory system 2000, the VCCQ power may be supplied to the controller 2200 through a second power terminal D2 of the memory system 2000, and the VDD power may be supplied to the controller 2200 through a third power terminal D3 of the memory system 2000.

Particularly, the LDO regulator 2210 is included in the controller 2200, but is not connected with other devices (or circuits) included in the controller 2200. That is, the LDO regulator 2210 is connected only between the first power terminal D1 and the interface 2300 to which the VCC power is applied. The LDO regulator 2210 receives the VCC power and reduces the received VCC power to a voltage used in the interface 2300 to transmit the reduced power to the interface 2300. For example, the LDO regulator 2210 may reduce the received VCC power to the VCCQ power, and transmit the reduced power to the interface 2300.

The memory device 2100 may include a plurality of storage devices, and when a large number of the storage devices are simultaneously operated or input/output data is momentarily large, an overload is generated in the memory device 2100 so that the power may flow backward. The power flowing backward is referred to as back power BP. The back power BP may flow backward through a line transmitting the VCC power to the memory device 2100 or the interface 2300. When the back power BP flows backward through the interface 2300, the back power BP may flow backward to the LDO regulator 2210 included in the controller 2200. In this case, even though the LDO regulator 2210 is included in the controller 2200, the LDO regulator 2210 is not connected to other devices included in the controller 220, so that the controller 2200 is prevented from being damaged due to the back power BP. That is, since the LDO regulator is connected between the first power terminal D1 and the interface 2300, the back power BP is not transmitted through the second power terminal D2 or the third power terminal D3 which may influence the controller 2200.

Accordingly, when the back power BP is generated in the memory device 2100, it is possible to protect the controller 2200, thereby improving the lifespan and reliability of the memory system 2000 including the controller 2200 and the memory device 2100.

Figure 3:
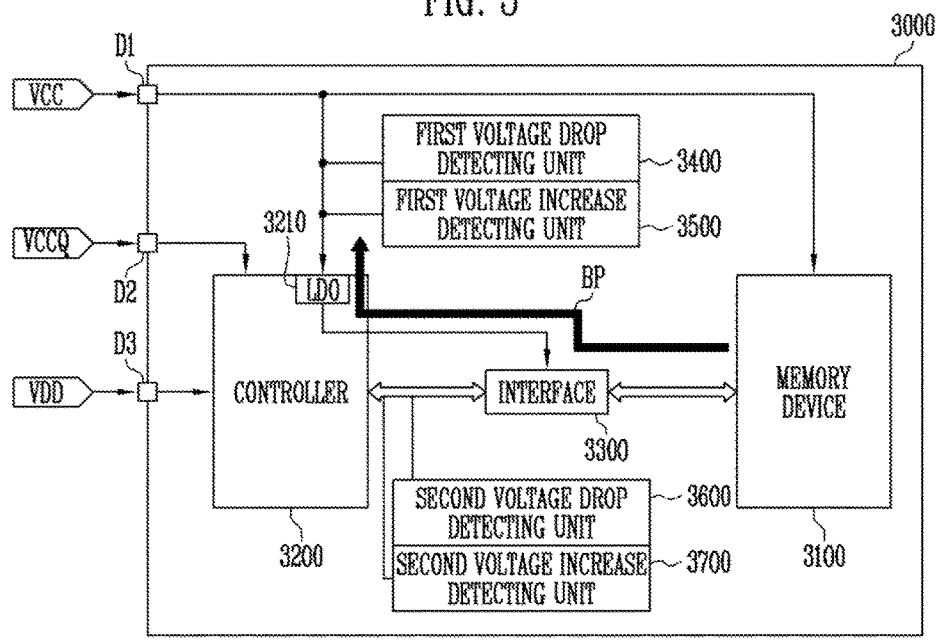
FIG. 3 is a diagram illustrating a memory system according to an embodiment of the present disclosure.

FIG. 3 is a diagram illustrating a memory system 3000 according to an embodiment of the present disclosure.

Referring to FIG. 3, the memory system 3000 may include a memory device 3100 for storing data, a controller 3200 for controlling the memory device 3100, an interface 3300 for exchanging a command and data between the controller 3200 and the memory device 3100, a first voltage drop detecting unit 3400, a first voltage increase detecting unit 3500, a second voltage drop detecting unit 3600 and a second voltage increase detecting unit 3700. The first voltage drop detecting unit 3400, the first voltage increase detecting unit 3500, the second voltage drop detecting unit 3600 and the second voltage increase detecting unit 3700 may detect power supplied to the memory system 3000 to uniformly maintain a voltage. The controller 3200 includes an LDO Regulator 3210 that reduces VCC power to supply the reduced VCC power to the interface 3300.

The memory device 3100 may include a plurality of storage devices. The memory device 3100 is similar to memory device 1100, which has been described with reference to FIG. 1, so that a detailed description of memory device 3100 will be omitted.

The controller 3200 may connect the memory device 3100 with a host (not illustrated). The controller 3200 may control the memory device 3100 in response to a command received from the host and transmit data received from the memory device 3100 to the host.

The interface 3300 is connected between the controller 3200 and the memory device 3100 to transmit a command and data.

Power is supplied from an external device (not illustrated) to operate the memory device 3100, the controller 3200, and the interface 3300. For example, the memory device 3100 receives VCC power from the external device, and the controller 3200 receives VCCQ power and VDD power from the external device. The interface 3300 may receive power through the LDO regulator 3200 included in the controller 3210. For example, the VCC power may be 3.3 V, the VCCQ power may be 1.8 V, and the VDD power may be 1.2 V. The VCC power may be supplied to the memory device 3100 through a first power terminal D1 of the memory system 3000, the VCCQ power may be supplied to the controller 2200 through a second power terminal D2 of the memory system 3000, and the VDD power may be supplied to the controller 3200 through a third power terminal D3 of the memory system 3000.

Particularly, the LDO regulator 3210 is included in the controller 3200, but is not connected with other devices (or circuits) included in the controller 3200. That is, the LDO regulator 2210 is connected only between the first power terminal D1, to which the VCC power is applied, and the interface 3300. The LDO regulator 3210 receives the VCC power, and reduces the received VCC power to a voltage used in the interface 3300 to transmit the reduced power to the interface 3300. For example, the LDO regulator 3210 may reduce the received VCC power to the VCCQ power, and transmit the reduced power to the interface 3300.

The memory device 3100 may include a plurality of storage devices, and when a large number of the storage devices are simultaneously operated or input/output data is momentarily large, an overload is generated in the memory device 3100 so that the power may flow backward. The power flowing backward is referred to as backpower BP. The back power BP may flow backward through a line transmitting the VCC power to the memory device 3100 or the interface 3300. When the back power BP flows backward through the interface 3300, the back power BP may flow backward to the LDO regulator 3200 included in the controller 3210. In this case, even though the LDO regulator 3210 is included in the controller 3200, the LDO regulator 3200 is not connected to other devices included in the controller 220, so that the controller 3200 is prevented from being damaged due to the back power BP. That is, since the LDO regulator is connected between the first power terminal D1 and the interface 3300, the back power BP is not transmitted through the second power terminal D2 or the third power terminal D3.

The first voltage drop detecting unit 3400 and the first voltage increase detecting unit 3500 are connected to a line between the first power terminal D1 and the LDO regulator 3210 to suppress a sharp drop and increase of the voltage of the line between the LDO regulator 3210 and the first power terminal D1.

When the voltage of the line connecting the first power terminal D1 and the LDO regulator 3210 is less than a first threshold voltage, the first voltage drop detecting unit 3400 may detect the situation and supply the VCC power to the LDO regulator 3210 through the first power terminal D1 again. For example, the first voltage drop detecting unit 3400 may include a voltage detection circuit. The first threshold voltage may be set to a voltage lower than the VCC power by 0.5 V to 1 V. When the voltage of the line connecting the first power terminal D1 and the LDO regulator 3210 may temporally increase, the first voltage increase detecting unit 3500 may include a capacitor so that the voltage of the line connecting the first power terminal D1 and the LDO regulator 3210 is stable.

Further, in order to stabilize the voltage of a line between the interface 3300 and the controller 3200, the second voltage drop detecting unit 3600 and the second voltage increase detecting unit 3700 may be connected to the line. The second voltage drop detecting unit 3600 may be configured in a similar manner to that of the first voltage drop detecting unit 3400, and the second voltage increase detecting unit 3700 may be configured in a similar manner to that of the first voltage increase detecting unit 3500. However, power having a VCCQ level less than that of the VCC power is used for the interface 3300, so that the second voltage drop detecting unit 3600 uses a second threshold voltage less than the first threshold voltage. For example, the second threshold voltage may be set to a voltage less than that of the VCCQ power by 0.3 V to 0.8 V. When the voltage used for the interface 3300 is decreased to a voltage less than the second threshold voltage, the second voltage drop detecting unit 3600 may detect the situation and control the LDO regulator 3210 to supply the voltage to the interface 3300 again.

As described above, the LDO regulator 3210 may prevent the controller 3200 from being damaged due to the back power BP, the first voltage drop detecting unit 3400 and the second voltage drop detecting unit 3600 may prevent an internal voltage of the memory system 3000 from being decreased, and the first voltage increase detecting unit 3500 and the second voltage increase detecting unit 3700 may prevent an internal voltage of the memory system from being momentarily increased.

Accordingly, it is possible to improve the lifespan and reliability of the memory system 3000.

Figure 4:
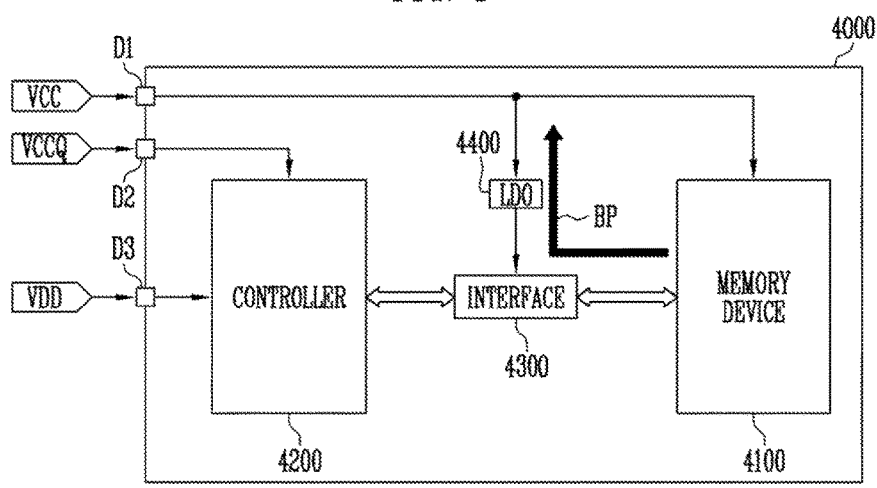
FIG. 4 is a diagram illustrating a memory system according to an embodiment of the present disclosure.

FIG. 4 is a diagram illustrating a memory system 4000 according to an embodiment of the present disclosure.

Referring to FIG. 4, the memory system 4000 may include a memory device 4100 for storing data, a controller 4200 for controlling the memory device 4100, an interface 4300 for exchanging a command and data between the controller 4200 and the memory device 4100, and an LDO regulator for reducing VCC power to supply the power to the interface 4300.

The memory device 4100 may include a plurality of storage devices. The memory device 4100 is similar to memory device 1100, which has been described with reference to FIG. 1, so that a detailed description of memory device 4100 will be omitted.

The controller 4200 may connect the memory device 4100 with a host (not illustrated). The controller 4200 may control the memory device 4100 in response to a command received from the host, and transmit data received from the memory device 4100 to the host.

The interface 4300 is connected between the controller 4200 and the memory device 4100 to transmit a command and data.

The LDO regulator 4400 is located outside the controller 4200 so as to prevent the controller 4200 from being influenced by back power BP. The LDO regulator 4400 receives the VCC power, and reduces the received VCC power to a voltage used in the interface 4300 to transmit the reduced power to the interface 4300.

Power is supplied from an external device (not illustrated) to operate the memory device 4100, the controller 4200, and the interface 4300. For example, the memory device 4100 receives VCC power from the external device, and the controller 4200 receives VCCQ power and VDD power from the external device. The interface 4300 receives the power through the LDO regulator 4400. For example, the VCC power may be 3.3 V, the VCCQ power may be 1.8 V, and the VDD power may be 1.2 V. The VCC power may be supplied to the memory device 4100 and the LDO regulator 4400 through a first power terminal D1 of the memory system 4000, the VCCQ power may be supplied to the controller 4200 through a second power terminal D2 of the memory system 4000, and the VDD power may be supplied to the controller 4200 through a third power terminal D3 of the memory system 4000.

The LDO regulator 4400 receives the VCC power, and reduces the received VCC power to a voltage used in the interface 4300 to transmit the reduced voltage to the interface 4300. For example, the LDO regulator 4400 may reduce the received VCC power to the VCCQ power, and transmit the reduced power to the interface 4400.

The memory device 4100 may include a plurality of storage devices, and when a large number of the storage devices are simultaneously operated or input/output data is momentarily large, an overload is generated in the memory device 4100 so that the power may flow backward. The power flowing backward is referred to as back power BP. The back power BP may flow backward through a line for transmitting the VCC power to the memory device 4100 or the interface 4300. Even though the back power BP flows backward through the interface 4300, the LDO regulator 4400 is located outside the controller 4200, so that the back power BP is not transmitted to the controller 4200.

Accordingly, when the back power BP is generated in the memory device 4100, it is possible to protect the controller 4200, thereby improving the lifespan and reliability of the memory system 4000 including the controller 4200 and the memory device 4100.

Figure 5:
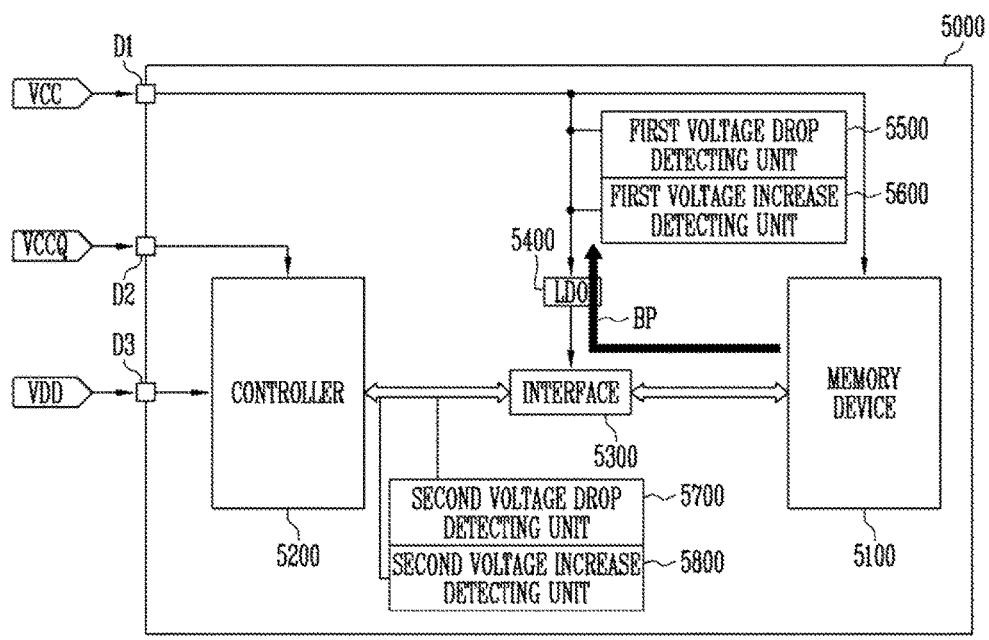
FIG. 5 is a diagram illustrating a memory system according to an embodiment of the present disclosure.

FIG. 5 is a diagram illustrating a memory system 5000 according to an embodiment of the present disclosure.

Referring to FIG. 5, the memory system 5000 may include a memory device 5100 for storing data, a controller 5200 for controlling the memory device 5100, an interface 5300 for exchanging a command and data between the controller 5200 and the memory device 5100, an LDO regulator 5400 for reducing VCC power to supply the reduced power to the interface 5300, a first voltage drop detecting unit 5500, a first voltage increase detecting unit 5600, a second voltage drop detecting unit 5700 and a second voltage increase detecting unit 5800. The first voltage drop detecting unit 5500, the first voltage increase detecting unit 5600, the second voltage drop detecting unit 5700 and the second voltage increase detecting unit 5800 may detect power supplied to the memory system 5000 to uniformly maintain a voltage.

The memory device 5100 may include a plurality of storage devices. The memory device 5100 is similar to memory device 1100, which has been described with reference to FIG. 1, so that a detailed description of memory device 5100 will be omitted.

The controller 5200 may connect the memory device 5100 with a host (not illustrated). The controller 5200 may control the memory device 5100 in response to a command received from the host and transmit data received from the memory device 5100 to the host.

The interface 5300 is connected between the controller 5200 and the memory device 5100 to transmit a command and data.

Power is supplied from an external device (not illustrated) to operate the memory device 5100, the controller 5200, and the interface 5300. For example, the memory device 5100 receives VCC power from the external device, and the controller 5200 receives VCCQ power and VDD power from the external device. For example, the VCC power may be 3.3 V, the VCCQ power may be 1.8 V, and the VDD power may be 1.2 V. The VCC power may be supplied to the memory device 5100 and the LDO regulator 5400 through a first power terminal D1 of the memory system 5000, the VCCQ power may be supplied to the controller 5200 through a second power terminal D2 of the memory system 5000, and the VDD power may be supplied to the controller 5200 through a third power terminal D3 of the memory system 5000.

The LDO regulator 5400 receives the VCC power, and reduces the received VCC power to a voltage used in the interface 5300 to transmit the reduced voltage to the interface 5300. For example, the LDO regulator 5400 may reduce the received VCC power to the VCCQ power, and transmit the reduced power to the interface 5300.

The memory device 5100 may include a plurality of storage devices, and when a large number of the storage devices are simultaneously operated or input/output data is momentarily large, an overload is generated in the memory device 5100 so that the power may flow backward. The power flowing backward is referred to as back power BP. The back power BP may flow backward through a line transmitting the VCC power to the memory device 5100 or the interface 5300. Even though the back power BP flows backward through the interface 5300, the LDO regulator 5400 is located outside the controller 5200, so that the back power BP is not transmitted to the controller 5200.

The first voltage drop detecting unit 5500 and the first voltage increase detecting unit 5600 are connected to a line between the first power terminal D1 and the LDO regulator 5400 to suppress a sharp drop and increase of the voltage of the line between the LDO regulator 5400 and the first power terminal D1.

When the voltage of the line connecting the first power terminal D1 and the LDO regulator 5400 is less than a first threshold voltage, the first voltage drop detecting unit 5500 may detect the situation and supply the VCC power to the LDO regulator 5400 through the first power terminal D1 again. For example, the first voltage drop detecting unit 5500 may include a voltage detection circuit. The first threshold voltage may be set to a voltage less than the VCC power by 0.5 V to 1 V. When the voltage of the line connecting the first power terminal D1 and the LDO regulator 5400 may temporally increase, the first voltage increase detecting unit 5600 may include a capacitor so that the voltage of the line connecting the first power terminal D1 and the LDO regulator 5400 is stable.

Further, in order to stabilize the voltage between the interface 5300 and the controller 5200, the second voltage drop detecting unit 5700 and the second voltage increase detecting unit 5800 may be connected to the line. The second voltage drop detecting unit 5700 may be configured in a similar manner to that of the first voltage drop detecting unit 5500, and the second voltage increase detecting unit 5800 may be configured in a similar manner to that of the first voltage increase detecting unit 5600. However, power having a VCCQ level less than that of the VCC power is used for the interface 5300, so that the second voltage drop detecting unit 5700 uses a second threshold voltage less than the first threshold voltage. For example, the second threshold voltage may be set to a voltage less than that of the VCCQ power by 0.3 V to 0.8 V. When the voltage used for the interface 5300 is decreased to a voltage less than the second threshold voltage, the second voltage drop detecting unit 5700 may detect the situation and control the LDO regulator 5400 to supply the voltage to the interface 5300 so that the LDO regulator 5400 supplies a voltage again.

As described above, the LDO regulator 5400 may supply power to the interface 5300 and prevent the back power BP from being transmitted to the controller 5200. Further, the first voltage drop detecting unit 5500 and the second voltage drop detecting unit 5700 may prevent an internal voltage of the memory system 5000 from being decreased, and the first voltage increase detecting unit 5600 and the second voltage increase detecting unit 5800 may prevent an internal voltage of the memory system 5000 from being momentarily increased.

Accordingly, it is possible to improve the lifespan and reliability of the memory system 5000.

As described above, the embodiments have been disclosed in the drawings and the specification. The specific terms used herein are for purposes of illustration, and do not limit the scope of the present disclosure defined in the claims. Accordingly, those skilled in the art will appreciate that various modifications and another equivalent example may be made without departing from the scope and spirit of the present disclosure. Therefore, the sole technical protection scope of the present disclosure will be defined by the technical spirit of the accompanying claims.

What is claimed is:

1. A memory system, comprising:
   a memory device supplied with a first power, and suitable for storing data;
   a controller supplied with a second power which is different from the first power, and suitable for controlling the memory device;
   an interface supplied with a third power, and suitable for exchanging a signal between the controller and the memory device; and
   a low dropout (LDO) regulator supplied with the first power that is supplied to the memory device, and suitable for converting the first power into the third power to supply the third power to the interface, wherein the third power has the same voltage level as the second power supplied to the controller.

2. The memory system of claim 1, wherein the LDO regulator is included inside the controller.

3. The memory system of claim 2, wherein the LDO regulator is connected between a first power terminal, to which the first power is applied, and the interface.

4. The memory system of claim 1, wherein when the LDO regulator is located outside the controller, the LDO regulator is connected between a first power terminal, to which the first power is applied, and the interface.

5. The memory system of claim 1, further comprising:
   a first voltage drop detecting unit and a first voltage increase detecting unit, each connected to a line between the LDO regulator and a first power terminal, to which the first power is applied.

6. The memory system of claim 5, wherein, when a voltage of the line connecting the first power terminal and the LDO regulator is less than a first threshold voltage, the first voltage drop detecting unit controls the first power to be supplied to the first power terminal again.

7. The memory system of claim 6, wherein the first threshold voltage is less than the first power.

8. The memory system of claim 5, wherein the first voltage increase detecting unit includes a capacitor.

9. The memory system of claim 1, further comprising:
   a first voltage drop detecting unit and a first voltage increase detecting unit connected to a line between the controller and the interface.

10. The memory system of claim 9, wherein, when a voltage of the line connecting the controller and the interface is less than a first threshold voltage, the first voltage drop detecting unit controls the LDO regulator so that the LDO regulator supplies a voltage again.

11. The memory system of claim 10, wherein the first threshold voltage is less than the second power.

12. The memory system of claim 9, wherein the first voltage increase detecting unit includes a capacitor.

13. A memory system, comprising:
    a memory device supplied with a first power through a first power terminal;
    a controller supplied with a second power through a second power terminal, wherein the second power is different from the first power;
    a low dropout (LDO) regulator suitable for reducing the first power, supplied through the first power terminal, to have the same voltage level as the second power; and
    an interface supplied with the second power, and suitable for exchanging a signal between the controller and the memory device.

14. The memory system of claim 13, wherein a first line, through which the first power supplied from the first power terminal is supplied to the interface, is isolated from a second line, through which the second power supplied from the second power terminal is supplied to the controller.

15. The memory system of claim 14, further comprising:
    a voltage drop detecting unit and a voltage increase detecting unit suitable for detecting a voltage of a line between the LDO regulator and the first power terminal to uniformly maintain a voltage of the first line.

16. The memory system of claim 15, wherein the voltage increase detecting unit includes a capacitor.

17. The memory system of claim 14, further comprising:
    a voltage drop detecting unit and a voltage increase detecting unit suitable for detecting a voltage of a line between the controller and the interface to uniformly maintain a voltage of the interface.

18. The memory system of claim 17, wherein the voltage increase detecting unit includes a capacitor.

* * * * *